United States Patent
Besser et al.

(10) Patent No.: US 6,235,179 B1
(45) Date of Patent: May 22, 2001

(54) ELECTROPLATED STRUCTURE FOR A FLAT PANEL DISPLAY DEVICE

(75) Inventors: Ronald S. Besser, Sunnyvale; Robert M. Duboc, Jr., Menlo Park, both of CA (US)

(73) Assignee: Candescent Technologies Corporation, San Jose, CA (US)

(*) Notice: Subject to any disclaimer, the term of this patent is extended or adjusted under 35 U.S.C. 154(b) by 0 days.

(21) Appl. No.: 09/310,464

(22) Filed: May 12, 1999

(51) Int. Cl.[7] .................................................. C25D 5/02
(52) U.S. Cl. ............................................ 205/122; 205/135
(58) Field of Search .................................. 205/122, 135, 205/157, 170, 183; 445/24, 50

(56) References Cited

U.S. PATENT DOCUMENTS

| | | | | |
|---|---|---|---|---|
| 5,098,860 | * | 3/1992 | Chakravorty et al. | 437/195 |
| 5,725,787 | * | 3/1998 | Curtin et al. | 216/25 |
| 5,818,153 | * | 10/1998 | Allen | 313/306 |
| 5,827,099 | * | 10/1998 | Spindt et al. | 445/24 |
| 5,972,193 | * | 10/1999 | Chou et al. | 205/122 |
| 5,989,404 | * | 11/1999 | Kiyomiyal et al. | 205/96 |
| 6,019,658 | * | 2/2000 | Ludwig et al. | 445/50 |
| 6,060,220 | * | 5/2000 | Shortland | 430/320 |
| 6,146,226 | * | 11/2000 | Spindt et al. | 445/24 |

* cited by examiner

*Primary Examiner*—Kathryn Gorgos
*Assistant Examiner*—Erica Smith-Hicks
(74) *Attorney, Agent, or Firm*—Wagner, Murabito & Hao LLP

(57) ABSTRACT

An electroplated structure for a field emission display device and method for forming an electroplated structure for a field emission display device. In one embodiment, the present invention forms a molded structure over selected portions of a flat panel display device. Next, the present embodiment deposits an electroplating seed layer over the molded structure. After the deposition of the electroplating seed layer, the present embodiment electroplates material onto portions of the electroplating seed layer such that an electroplated structure is formed at desired regions of the flat panel display device. In such an embodiment, the present invention provides an electroplated structure which contains substantially no polyimide material. As a result, the present embodiment eliminates the cost and production of outgassed contaminants associated with prior art structures.

22 Claims, 13 Drawing Sheets

ELECTROPLATED STRUCTURE FOR A FLAT PANEL DISPLAY DEVICE

FIELD OF THE INVENTION

The present claimed invention relates to the field of flat panel displays. More particularly, the present claimed invention relates to interior structures of a flat panel display device.

BACKGROUND ART

Flat panel display devices often operate using electron emitting structures, such as, for example, Spindt-type field emitters. These types of flat panel displays typically employ a metallized polyimide structure to focus or define the path of electrons emitted from the electron emitting structures. In one prior art approach, the polyimide structure is referred to as a "focus waffle." The focus waffle is comprised of a "sheet" or film-like structure having a plurality of openings formed therethrough. The focus waffle is disposed between the electron emitting structures and the faceplate such that emitted electrons pass through openings in the focus waffle structure, and are directed towards corresponding sub-pixel regions.

Additionally, the aforementioned sub-pixel regions on the faceplate of a flat panel display are typically separated by a polyimide-based opaque mesh-like structure commonly referred to as a black matrix. By separating sub-pixel regions, the polyimide black matrix prevents electrons directed at one sub-pixel from being "back-scattered" and striking another sub-pixel. In so doing, the polyimide black matrix helps maintain a flat panel display with sharp resolution. In addition, the polyimide black matrix is also used as a base on which to locate structures such as, for example, support walls.

Unfortunately, due to the extremely high cost of certain types of polyimide material (especially photo-patternable polyimide material), such prior art polyimide-based black matrix and focus waffle structures are extremely expensive. As a result, a conventional polyimide black matrix and/or a polyimide focus waffle introduces substantial additional costs to flat panel display fabrication. As yet another disadvantage, such prior art polyimide focus waffle and black matrix structures are a major source of contamination in flat panel display devices. Typically, such contamination results from electron bombardment of the polyimide black matrix or focus waffle during normal operation of the flat panel display device. Hence, such "dirty" polyimide focus waffle and polyimide black matrix structures introduce contaminate particles and/or desorbing gaseous species into the evacuated environment of the flat panel display device. These contaminate particles degrade the performance of the flat panel display device and reduce the effective lifetime of the flat panel display device via contamination of field emission surfaces and other possible mechanisms.

Thus, a need exists for a structure on the display cathode which effectively directs electrons emitted from electron emitters. A further need exists on the faceplate for a structure which effectively separates neighboring phosphor sub-pixels. A further need exists for a structure which meets the above-listed needs and which eliminates the use of expensive and contaminant producing polyimide material.

SUMMARY OF INVENTION

The present invention provides, in one embodiment, a structure on the display cathode which effectively directs electrons emitted from electron emitters. The present invention provides, in another embodiment, a structure on the faceplate which effectively separates neighboring phosphor sub-pixels. The present invention, in each of the above-mentioned embodiments, achieves the above-listed accomplishments without requiring the use of expensive and contaminant-producing polyimide material.

Specifically, in one embodiment, the present invention forms a molded structure over selected portions of a flat panel display device. Next, the present embodiment deposits an electroplating seed layer over the molded structure. After the deposition of the electroplating seed layer, the present embodiment electroplates material onto portions of the electroplating seed layer such that an electroplated structure is formed at desired regions of the flat panel display device. In such an embodiment, the present invention provides an electroplated structure which contains substantially no polyimide material. As a result, the present embodiment eliminates the cost and production of outgassed contaminants associated with prior art structures.

In another embodiment, the present invention includes the features of the above-described embodiment, and further recites that the electroplated structure is a black matrix structure of a flat panel display device.

In yet another embodiment, the present invention includes the features of the first above-described embodiment, and further recites that the electroplated structure is a focus waffle structure of a flat panel display device.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention.

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
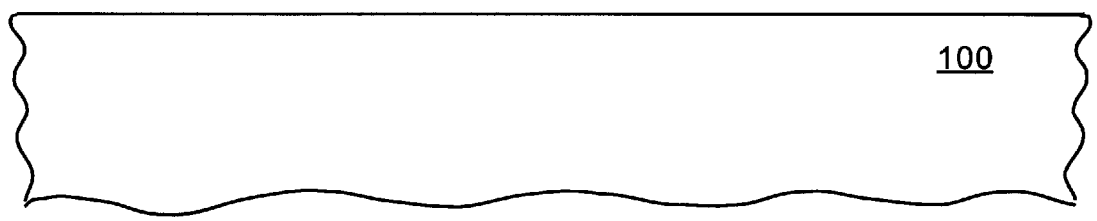
FIGS. 1A–1F are side sectional views of process steps used to form an electroplated structure in accordance with one embodiment of the present claimed invention.

With reference now to FIGS. 1A–1F, side sectional views of process steps used to form an electroplated structure in accordance with the present claimed invention are shown. Referring specifically to FIG. 1A, a side-sectional view of a starting point in the formation of an electroplated structure is shown. The following detailed description of the process steps of FIGS. 1A–1F, will pertain to the formation of an electroplated focus waffle as well as to the formation of an electroplated black matrix. Hence, as will be set forth below, the process steps of the present embodiment are adapted for use in forming an electroplated focus waffle and/or an electroplated black matrix. Although portions of the present embodiment refer to a black matrix, it will be understood that the term "black" refers to the opaque, low reflectivity characteristic of the matrix. Thus, the present invention is also well suited to having a color other than black.

With reference to FIG. 1A, the present embodiment begins with underlying structure 100. In one embodiment (e.g. an embodiment which forms an electroplated black matrix, "a black matrix embodiment"), underlying structure 100 is a faceplate of, for example, a flat panel display device. In another embodiment, (e.g. an embodiment which forms an electroplated focus waffle, "a focus waffle embodiment"), underlying structure 100 is a cathode of, for example, a flat panel display device such as a field emission display device.

Figure 1B:
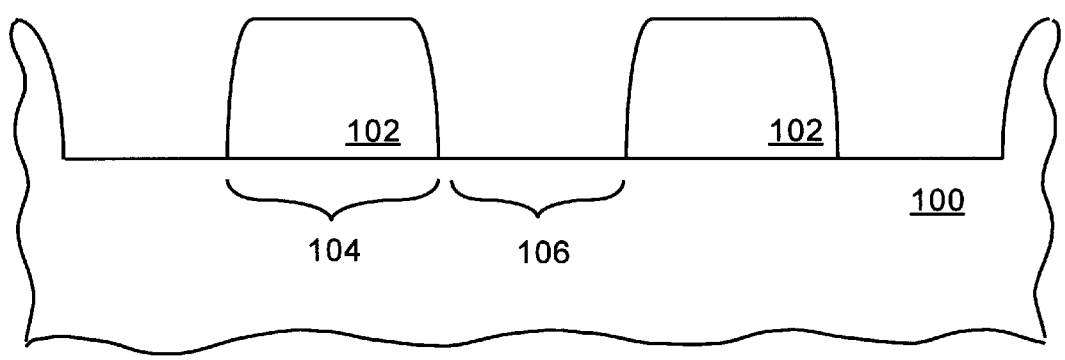

Referring next to FIG. 1B, the present embodiment then forms molded structures over selected portions 104 of the flat panel display device. In the present embodiments, the molded structures are comprised of structures 102 of photosensitive material such as photoresist. In one embodiment, the photoresist is deposited, masked, exposed, and the unexposed photoresist is then rinsed to form structures 102 at desired locations. As shown in FIG. 1B, structures 102 are formed overlying regions 104 and are not formed above regions 106. In the black matrix embodiment, regions 104 are sub pixel regions, and regions 106 are regions disposed between sub-pixel regions 104. Furthermore in the black matrix embodiment, structures 102 have a height of approximately 50 microns. In a focus waffle embodiment, regions 104 are electron emitting portions of a field emission display device, and regions 106 are regions between electron emitting portions of the field emission display device. Additionally, in the focus waffle embodiment, structures 102 have a height of approximately 40–60 microns. Although such specific dimensions and materials will be recited in the present application, it will be understood that these dimensions and materials are exemplary and that the present invention is well suited to the use of various other dimensions and materials.

Figure 1C:
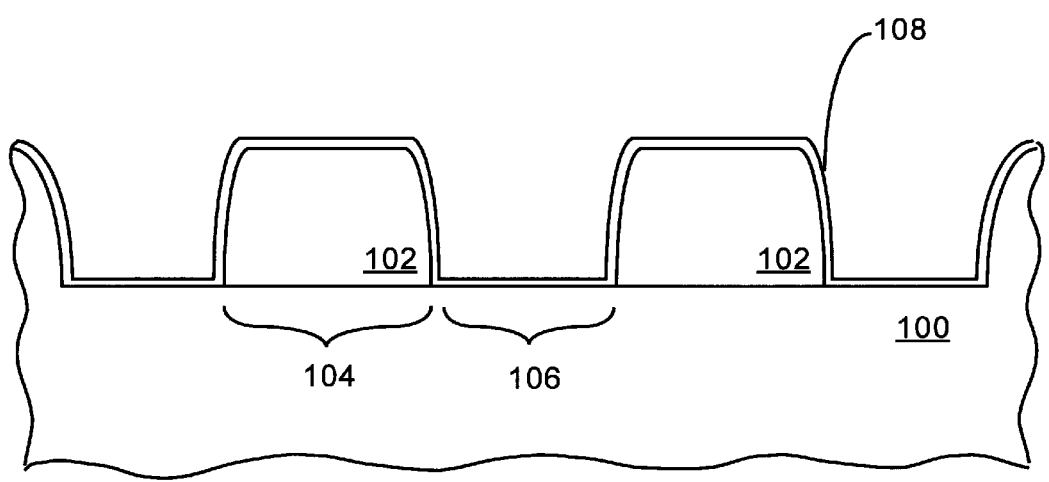

With reference now to FIG. 1C, in the present embodiments, an electroplating seed layer 108 is then deposited over structures 102 and regions 106. Electroplating seed layer 108 of the present embodiment is a double-layer of material which is sputter-coated over structures 102 and regions 106. In one embodiment, electroplating seed layer 108 is comprised of an initial opaque, low reflectivity sputter-coated layer of, for example, "black chrome", followed by the deposition of an electroplating-conducive material. Such electroplating-conducive material is comprised, for example, of nickel, gold, copper, silver, chrome, and the like. In one embodiment, electroplating seed layer 108 is formed having a thickness of approximately 1000 Angstroms. Additionally, in the black matrix embodiment, electroplating seed layer 108 does need to have a first opaque, low reflectivity layer.

Figure 1D:
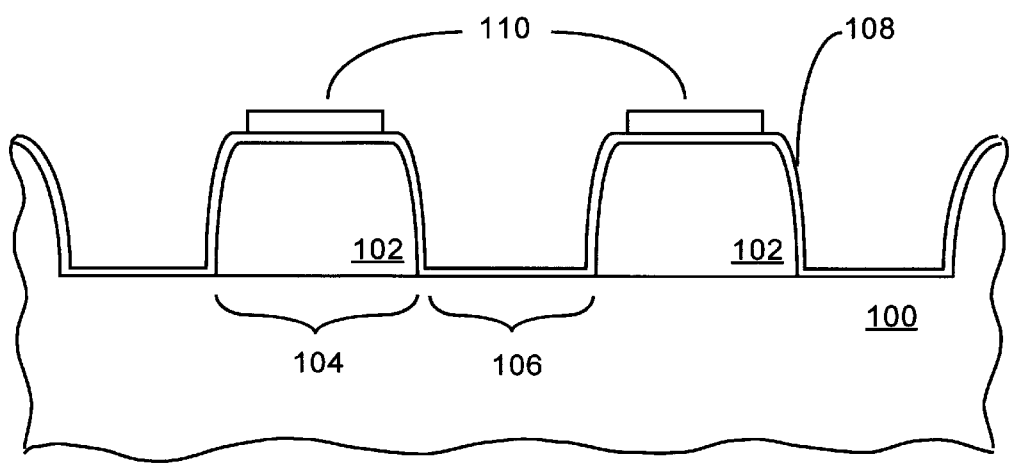

Referring now to FIG. 1D, after the deposition of electroplating seed layer 108, the present embodiment deposits second molded structures 110 on respective top surfaces of photoresist structures 102. In the present embodiments, the second molded structures are comprised of sections of photosensitive material such as photoresist. In one embodiment, the photoresist comprising the second molded structures is deposited, masked, exposed, and the unexposed photoresist is then rinsed to leave second molded structures 110 on the respective top surfaces of photoresist structures 102. In one embodiment second molded structures 110 have a thickness of approximately 5–10 microns.

Figure 1E:
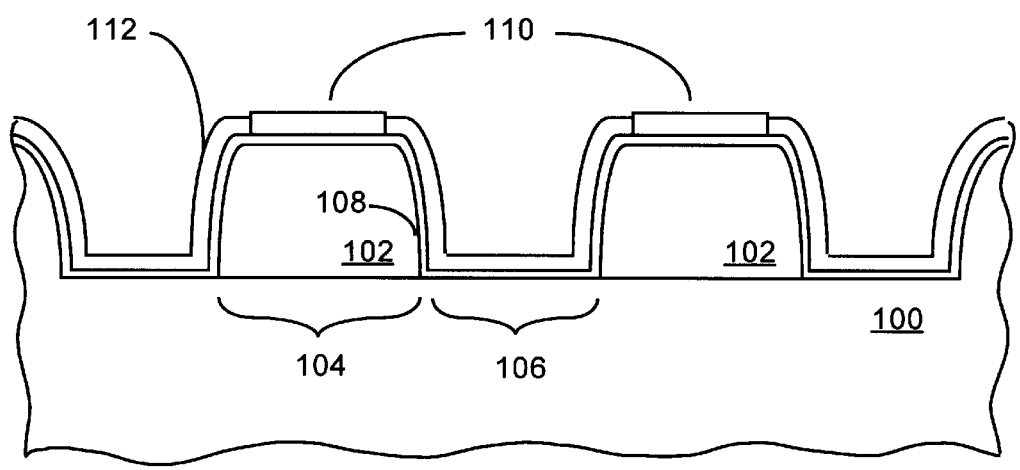

Next, as shown at FIG. 1E, the present embodiment electroplates layer of material 112 onto portions of electroplating seed layer 108 such that an electroplated structure is formed at desired regions of the flat panel display device. More specifically, the structure of FIG. 1D has a potential applied thereto and is dipped in an aqueous solution of the material to be electroplated. The material to be electroplated to form electroplated layer 112 is, for example, nickel, gold, copper, silver, chromium, and the like. As shown in FIG. 1E, because second molded structures 110 are not conductive, substantially no material is electroplated thereon during the electroplating process. Hence, electroplated layer 112 is formed on electroplating seed layer 108 except for those portions of electroplating seed layer 108 which are covered by second molded structures 110. Thus, the respective top surfaces of structures 102 have little or no material electroplated thereover. Furthermore, in the present embodiment, electroplated layer 112 has a thickness of approximately 5–10 microns.

Figure 1F:
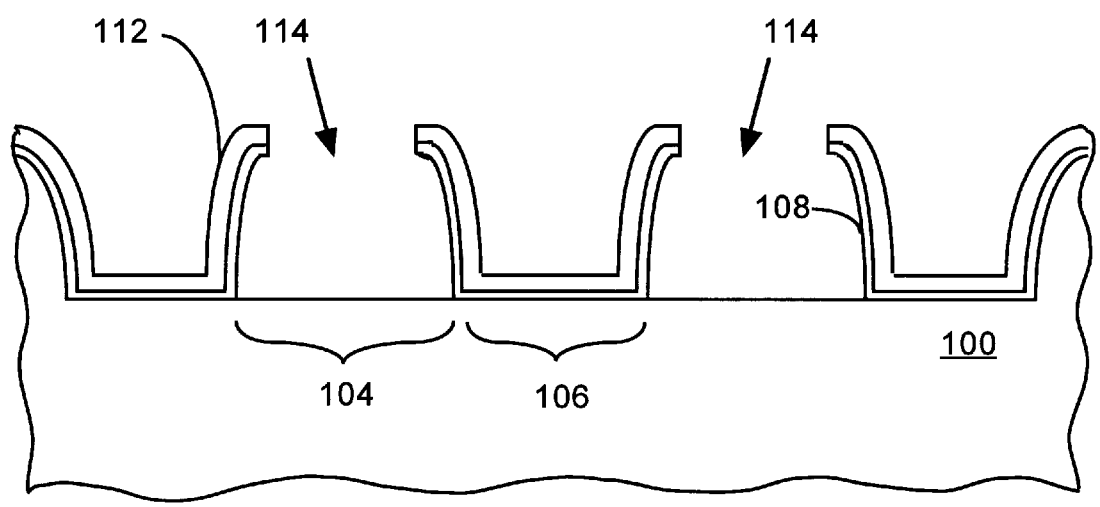

With reference now to FIG. 1F, the present embodiments then remove second molded structures 110 from respective top surfaces of photoresist structures 102. Removal of second molded structures 110 is accomplished using a photoresist removal process. The present embodiments then remove those portions of electroplating seed layer 108 which were residing beneath second molded structures 110 using an etchant (or etchants) corresponding to the material (or materials) comprising electroplating seed layer 108. Additionally, as shown in FIG. 1F, the present embodiments also remove photoresist structures 102 (using another photoresist removal process) such that a cavity 114 partially encapsulated by electroplated layer 112 (and underlying electroplating seed layer 108) remains. In a black matrix embodiment, cavity 114 is adapted to have sub-pixel forming material deposited therein. In a focus waffle embodiment, the remaining electroplated layer 112 forms walls which are adapted to focus electrons emitted by field emitters within the field emission display device. Hence, the present embodiments provide an electroplated black matrix and/or an electroplated focus waffle without requiring the use of expensive and contaminant producing polyimide material. Thus, the electroplated structure of the present embodiments is cheaper and cleaner than existing products.

As yet another advantage of the present embodiments, remaining portions of electroplated layer 112 can also be used to buttress support structures of the flat panel display device. For example, a support wall can reside above region 106 of the present embodiments. Furthermore, although remaining portions of electroplated layer 112 may appear "dome-shaped" above regions 104, the present embodiments are well suited to varying the shape of structures 102 and, thus, create remaining portions of electroplated layer 112 with a greater or lesser amount of curvature. In one embodiment, the curved shape of remaining portions of electroplated layer 112 helps to reflect electrons back towards the sub-pixel regions. Also, the conductive nature of remaining portions of electroplated layer 112 insures efficient bleeding of excess charges when desired.

Figure 2A:
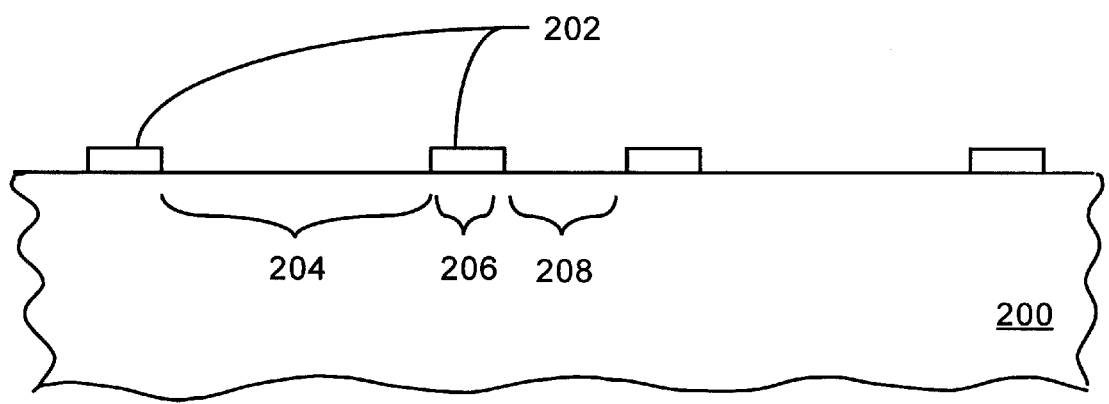
FIGS. 2A–2F are side sectional views of process steps used to form an electroplated structure in accordance with another embodiment of the present claimed invention.

With reference to FIGS. 2A–2F, side sectional views illustrating steps performed in accordance with other embodiments of the present invention are shown. As shown in FIG. 2A, the present embodiment begins with underlying structure 200. In one embodiment (e.g. an embodiment which forms an electroplated black matrix, "a black matrix embodiment"), underlying structure 200 is a faceplate of, for example, a flat panel display device. In another embodiment, (e.g. an embodiment which forms an electroplated focus waffle, "a focus waffle embodiment"), underlying structure 200 is a cathode of, for example, a flat panel display device such as a field emission display device.

Figure 2B:
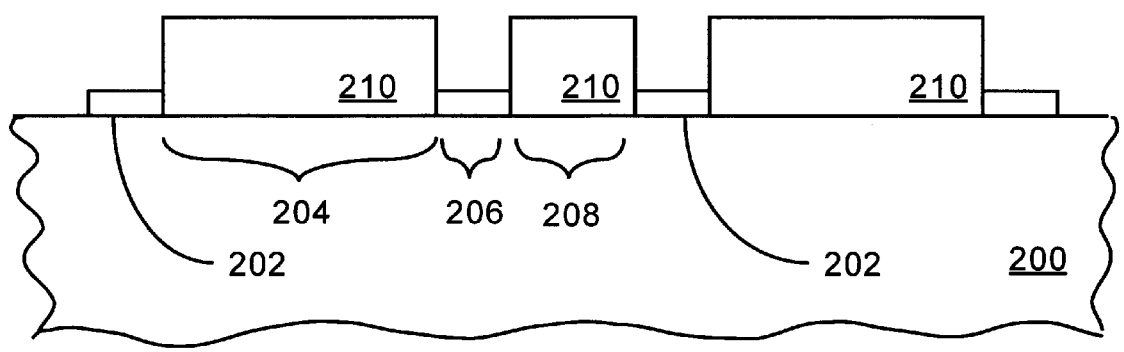

Referring still to FIG. 2A, the present embodiment then forms a thin film black matrix 202 over underlying structure 200. As shown in FIG. 2B, portions of thin film black matrix 202 are formed overlying regions 206 and are not formed above regions 204 and 208. In the black matrix embodiment, regions 204 and 208 are sub pixel regions and support structure regions, respectively. That is, in such an embodiment, a sub-pixel will subsequently be formed above region 204 and a support structure will be disposed above region 208. Regions 206 are regions above which will be formed an electroplated black matrix. In a focus waffle embodiment, region 204 resides above electron emitting portions of a field emission display device, and regions 208 are regions between electron emitting portions of the field emission display device which may have support structures disposed thereover. Regions 206, in such an embodiment, are regions above which will be formed an electroplated focus waffle.

Referring next to FIG. 2B, the present embodiment then forms molded structures over selected portions 204 and 208 of the flat panel display device. In the present embodiments, the molded structures are comprised of pads 210 of photosensitive material such as photoresist. In one embodiment, the photoresist is deposited, masked, exposed, and the unexposed photoresist is then rinsed to form pads 210 at desired locations. In one black matrix embodiment, the photosensitive material, after deposition above the entire surface of underlying structure 200 (including above thin film black matrix 202), is then exposed to light from the exterior surface of underlying structure 200 (a faceplate in this embodiment). By exposing the photosensitive material to light from the exterior surface of the faceplate, thin film black matrix 202 masks those portions of the photosensitive material which reside above thin film black matrix 202. As a result, those portions of photosensitive material which reside above thin film black matrix 202 are prevented from being exposed. Thus, only the photosensitive material residing above regions 204 and 208 is cured.

As shown in FIG. 2B, pads 210 are formed overlying regions 204 and 208 and are not formed above regions 206 (i.e. pads 210 are not formed above thin film black matrix 202). Additionally, in the present embodiments, photoresist pads 210 have vertically oriented side surfaces and a horizontally oriented top surface. In the black matrix embodiment, photoresist pads 210 have a height of approximately 50 microns. In the focus waffle embodiment, photoresist pads 210 have a height of approximately 40–60 microns. Although such specific dimensions and materials will be recited in the present application, it will be understood that these dimensions and materials are exemplary and that the present invention is well suited to the use of various other dimensions and materials.

Figure 2C:
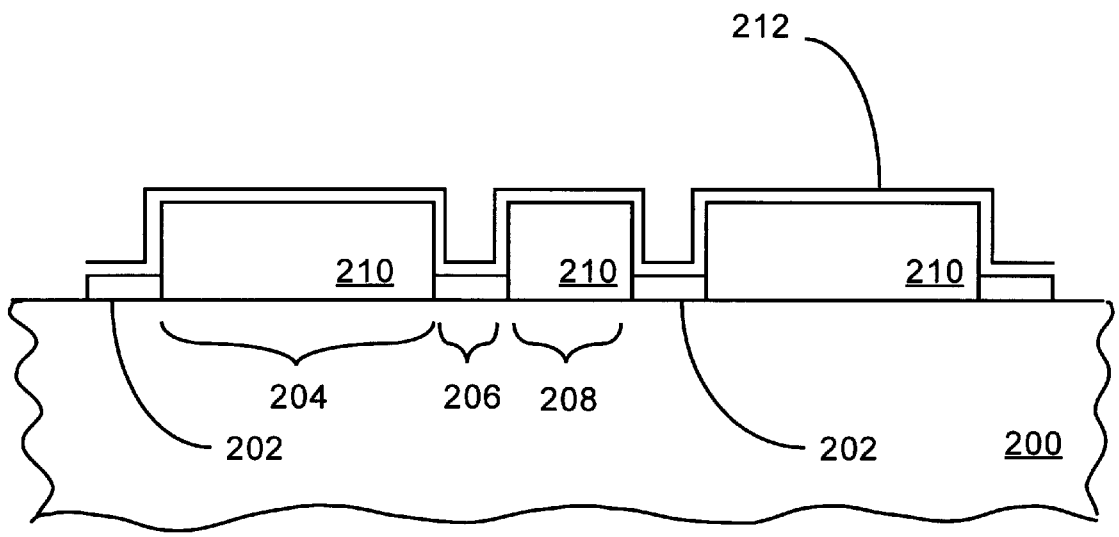

With reference now to FIG. 2C, in the present embodiments, an electroplating seed layer 212 is then deposited over photoresist pads 210 and above thin film black matrix 206. Electroplating seed layer 212 of the present embodiments is a double-layer of material which is sputter-coated over photoresist pads 210 and above thin film black matrix 202. In one embodiment, electroplating seed layer 212 is comprised of an initial opaque, low reflectivity sputter-coated layer of, for example, "black chrome", followed by the deposition of an electroplating-conducive material. Such electroplating-conducive material is comprised, for example, of nickel, gold, copper, silver, chromium, and the like. In one embodiment, electroplating seed layer 212 is formed having a thickness of approximately 1000 Angstroms. Additionally, in the focus waffle embodiment, electroplating seed layer 212 does need to have a first opaque, low-reflectivity layer.

Figure 2D:
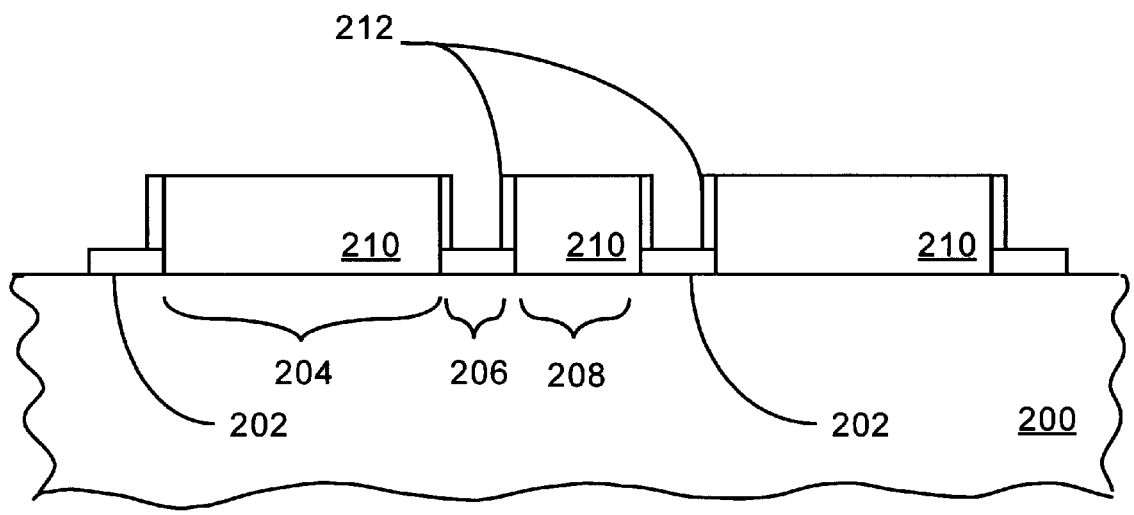

Referring now to FIG. 2D, the present embodiments then remove electroplating seed layer 212 from the horizontally oriented top surfaces of photoresist pads 210. As shown in FIG. 2D, the present embodiment also remove electroplating seed layer 212 from the top surface of thin film black matrix 202. In one embodiment, electroplating seed layer 212 is removed from the aforementioned horizontally oriented top surfaces using a directional dry etch such as, for example, a reactive-ion etch. As a result, electroplating seed layer 212 remains on the vertically oriented surfaces of photoresist pads 210.

Figure 2E:
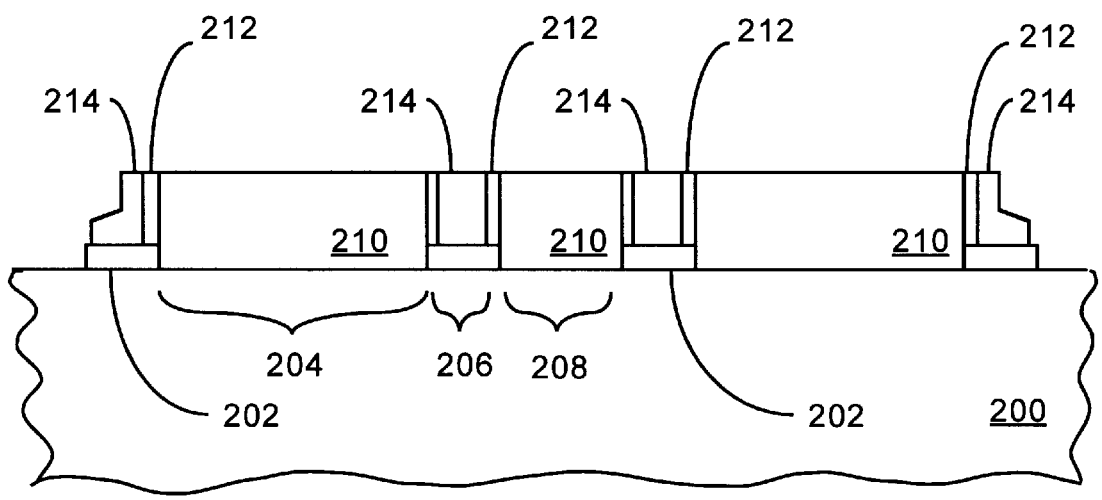

Next, as shown at FIG. 2E, the present embodiments electroplate of layer of material 214 onto the remaining portions of electroplating seed layer 212 such that an electroplated structure is formed at desired regions of the flat panel display device. Moreover, the present embodiments electroplate material onto the vertically-oriented, electroplating seed layer-coated, side surfaces of photoresist pads 210 without substantially electroplating material onto the horizontally oriented top surface of photoresist pads 210. More specifically, the structure of FIG. 2D has a potential applied thereto and is dipped in an aqueous solution of the material to be electroplated. The material to be electroplated to form electroplated layer 214 is, for example, nickel, gold, copper, silver, chrome, and the like. Because electroplating seed layer 212 remains only on the vertically oriented surfaces of photoresist pads 210 after the etching process illustrated in FIG. 2D, remaining portions of electroplating seed layer 212 function as an "electroplating frame". That is, the electroplating process is confined to the area between the electroplating seed layer-coated vertically oriented side surfaces of photoresist pads 210. Hence, in the present embodiment, the electroplating process is controlled and confined by previous easily and accurately controllable manufacturing steps used to form photoresist pads 210.

Figure 2F:
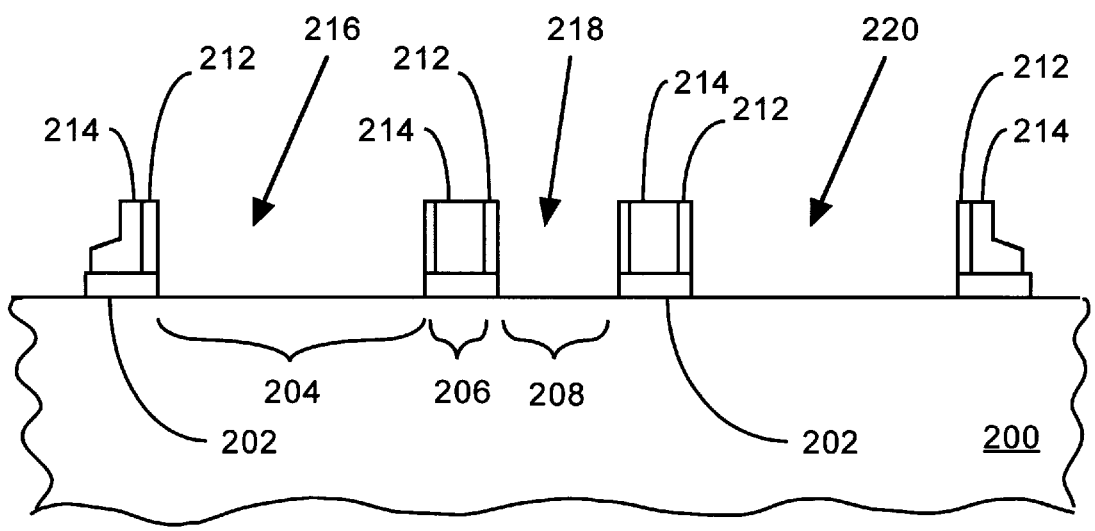

With reference now to FIG. 2F, the present embodiments then remove photoresist pads 210 (using a photoresist removal process) such that cavities 216, 218, and 220 partially encapsulated by electroplated layer 214 (and underlying electroplating seed layer 212) remain. In a black matrix embodiment, a portion of the cavities (e.g. cavities 216 and 220) is adapted to have sub-pixel forming material deposited therein. A second portion of the cavities (e.g. cavities 218) are adapted to have a support structure disposed therein. In a focus waffle embodiment, a portion of the cavities (e.g. cavities 216 and 220) is adapted to focus electrons emitted by field emitters within the field emission display device. A second portion of the cavities (e.g. cavities 218) are adapted to have a support structure disposed therein. Hence, the present embodiments provide an electroplated black matrix and/or an electroplated focus waffle without requiring the use of expensive and contaminant producing polyimide material. Thus, the electroplated structure of the present embodiments is cheaper and cleaner than existing products.

As yet another advantage of the present embodiments, remaining portions of electroplated layer 212 can also be used to buttress support structures of the flat panel display device. For example, a support wall can reside above region 208 of the present embodiments. Also, the conductive nature of remaining portions of electroplated layer 212 insures efficient bleeding of excess charges when desired.

Figure 3:
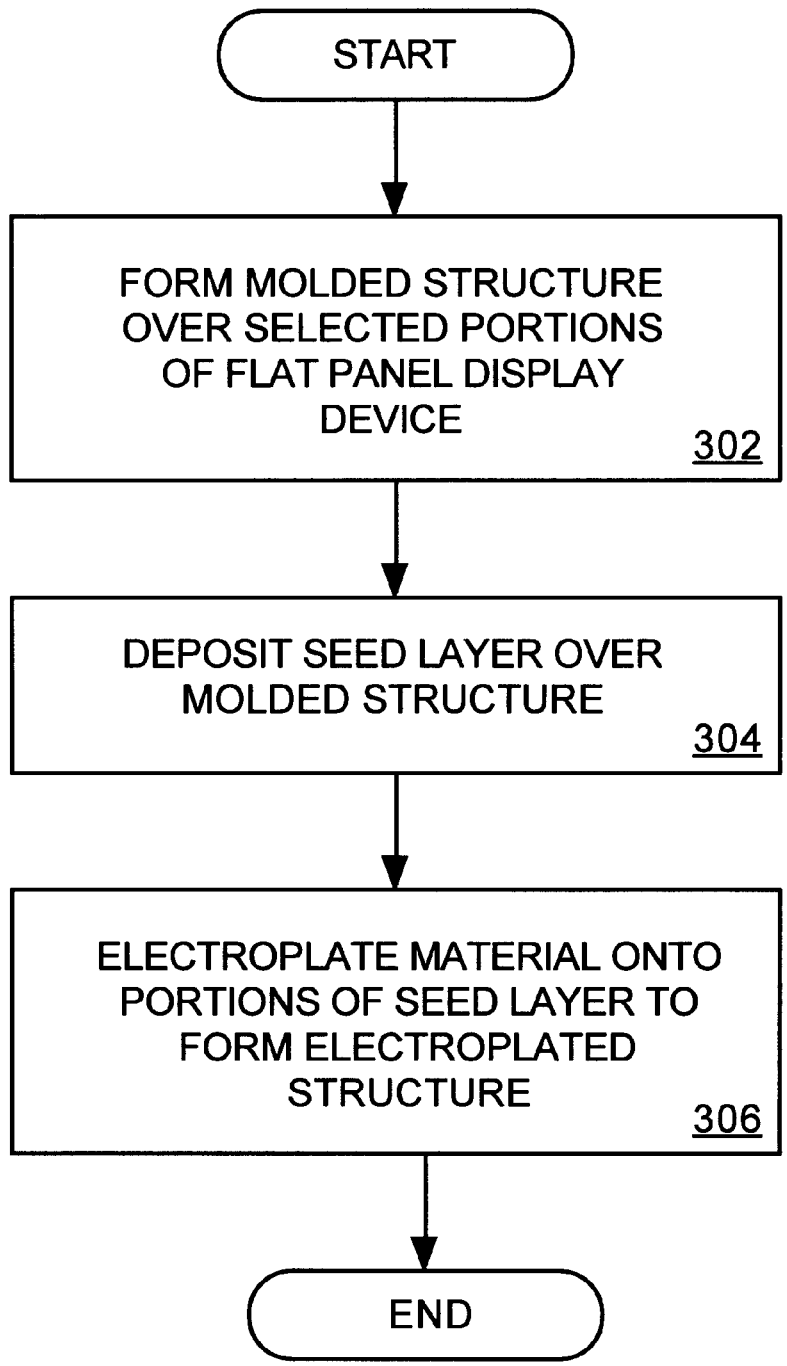
FIG. 3 is a flow chart of steps performed in accordance with one embodiment of the present claimed invention.

Referring now to FIG. 3, a flow chart 300 succinctly setting forth the aforementioned steps of the present invention is shown. At step 302, the present invention forms molded structures over selected portions of a flat panel display device.

Next, at step 304, the present invention deposits an electroplating seed layer over the molded structures formed at step 302.

Referring now to step 306, the present invention then electroplates material onto portions of the electroplating seed layer which was deposited at step 304. In so doing, the present invention forms an electroplated structure for a flat panel display device.

Thus, the present invention provides, in one embodiment, a structure on the display cathode which effectively directs electrons emitted from electron emitters. The present invention provides, in another embodiment, a structure on the faceplate which effectively separates neighboring phosphor sub-pixels. The present invention, in each of the above-mentioned embodiments, achieves the above-listed accomplishments without requiring the use of expensive and contaminant producing polyimide material.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A method for forming an electroplated structure in a flat panel display device, said method comprising the steps of:
    a) forming photoresist structures over sub-pixel regions of a flat panel display device;
    b) depositing an opaque, low reflectivity electroplating seed layer over said photoresist structures, said step b) further comprising the step of:
        b1) depositing molded structures on respective top surfaces of said photoresist structures; and
    c) electroplating material onto said photoresist structures of said electroplating seed layer without substantially electroplating said material onto said molded structures residing on said respective top surfaces of said photoresist structures such that a black matrix is formed at desired regions of said flat panel display device.

2. The method for forming an electroplated structure in a flat panel display device as recited in claim 1, wherein said flat panel display device is a field emission display device.

3. The method for forming an electroplated structure in a flat panel display device as recited in claim 1 further comprising the steps of:
    d) removing said molded structures from said respective top surfaces of said photoresist structures;
    e) removing portions of said opaque, low reflectivity electroplating seed layer which were residing beneath said molded structures; and
    f) removing said photoresist structures such that a cavity partially encapsulated by said electroplated material remains, said cavity adapted to have sub-pixel forming material deposited therein.

4. The method for forming an electroplated structure in a flat panel display device as recited in claim 1 wherein said method comprises forming a thin film black matrix over a faceplate of said flat panel display device before performing step a), said thin film black matrix having openings formed therethrough such that portions of said faceplate are not covered by said thin film black matrix;
    wherein step a) comprises forming photoresist pads over said portions of said faceplate which are not covered by said thin film black matrix, said photoresist pads having vertically oriented side surfaces and a horizontally oriented top surface;
    wherein step b) comprises depositing an electroplating seed layer over said photoresist pads and said thin film black matrix, said step b) further comprising the steps of:
        b1) removing said electroplating seed layer from said horizontally oriented top surface of said photoresist pads; and
    wherein step c) comprises electroplating said material onto said vertically oriented side surfaces of said photoresist pads without substantially electroplating said material onto said horizontally oriented top surface of said photoresist pads.

5. The method for forming an electroplated structure in a flat panel display device as recited in claim 4 further comprising the step of:
    d) removing said photoresist pads such that a plurality of cavities partially encapsulated by said electroplated material remain, a portion of said cavities adapted to have sub-pixel forming material deposited therein.

6. The method for forming an electroplated structure in a flat panel display device as recited in claim 5 wherein a second portion of said cavities is adapted to have support structures disposed therein.

7. The method for forming an electroplated structure in a flat panel display device as recited in claim 1 wherein said electroplating seed layer is comprised of Nickel.

8. The method for forming an electroplated structure in a flat panel display device as recited in claim 1 wherein said electroplating material is comprised of Nickel.

9. A method for forming an electroplated black matrix in a flat panel display device, said method comprising the steps of:
    a) forming photoresist structures over sub-pixel regions of said flat panel display device;
    b) depositing an opaque, low reflectivity electroplating seed layer over said photoresist structures, said step b) further comprising the step of:

b1) depositing molded structures on respective top surfaces of said photoresist structures; and c) electroplating material onto said photoresist structures without substantially electroplating said material onto said molded structures residing on said respective top surfaces of said photoresist structures.

10. The method for forming an electroplated structure in a flat panel display device as recited in claim 9, wherein said flat panel display device is a field emission display device.

11. The method for forming an electroplated structure in a flat panel display device as recited in claim 9 further comprising the steps of:

d) removing said molded structures from said respective top surfaces of said photoresist structures;

e) removing portions of said opaque, low reflectivity electroplating seed layer which were residing beneath said molded structures; and f) removing said photoresist structures such that a cavity partially encapsulated by said electroplated material remains, said cavity adapted to have sub-pixel forming material deposited therein.

12. A method for forming an electroplated structure in a flat panel display device, said method comprising the steps of:

a) forming a thin film black matrix over a faceplate of said flat panel display device, said thin film black matrix having openings formed therethrough such that portions of said faceplate are not covered by said thin film black matrix;

b) forming photoresist pads over said portions of said faceplate which are not covered by said thin film black matrix, said photoresist pads having vertically oriented side surfaces and a horizontally oriented top surface;

c) depositing an electroplating seed layer over said photoresist pads and said thin film black matrix, said step c) further comprising the steps of:

c1) removing said electroplating seed layer from said horizontally oriented top surface of said photoresist pads; and d) electroplating material onto said vertically oriented side surfaces of said photoresist pads without substantially electroplating said material onto said horizontally oriented top surface of said photoresist pads.

13. The method for forming an electroplated structure in a flat panel display device as recited in claim 12, wherein said flat panel display device is a field emission display device.

14. The method for forming an electroplated structure in a flat panel display device as recited in claim 12 further comprising the step of:

e) removing said photoresist pads such that a plurality of cavities partially encapsulated by said electroplated material remain, a portion of said cavities adapted to have subpixel forming material deposited therein.

15. The method for forming an electroplated structure in a flat panel display device as recited in claim 14 wherein a second portion of said cavities is adapted to have support structures disposed therein.

16. A method for forming an electroplated structure in a flat panel display device, said method comprising the steps of:

a) forming photoresist structures over electron emitting regions of a flat panel display device;

b) depositing an electroplating seed layer over said photoresist structures, said step b) further comprising the step of:

b1) depositing molded structures on respective top surfaces of said photoresist structures; and c) electroplating material onto said photoresist structures of said electroplating seed layer without substantially electroplating said material onto said molded structures residing on said respective top surfaces of said photoresist structures such that a focus waffle is formed at desired regions of said flat panel display device.

17. The method for forming an electroplated structure in a flat panel display device as recited in claim 16, wherein said flat panel display device is a field emission display device.

18. The method for forming an electroplated structure in a flat panel display device as recited in claim 16 further comprising the steps of:

d) removing said molded structures from said respective top surfaces of said photoresist structures;

e) removing portions of said electroplating seed layer which were residing beneath said molded structures; and f) removing said photoresist structures such that a cavity partially encapsulated by electroplated walls remains, said electroplated walls adapted to focus said electrons emitted within said field emission display device.

19. The method for forming an electroplated structure in a flat panel display device as recited in claim 16 wherein said method comprises forming a thin film focus waffle over a portion of said flat panel display device before performing step a), said thin film focus waffle having openings formed therethrough such that electron emitting portions of said flat panel display device are not covered by said thin film focus waffle;

wherein step a) comprises forming photoresist pads over said electron emitting portions of said flat panel display device which are not covered by said thin film focus waffle, said photoresist pads having vertically oriented side surfaces and a horizontally oriented top surface;

wherein step b) comprises depositing an electroplating seed layer over said photoresist pads and said thin film focus waffle, said step b) further comprising the steps of:

b1) removing said electroplating seed layer from said horizontally oriented top surface of said photoresist pads; and wherein step c) comprises electroplating said material onto said vertically oriented side surfaces of said photoresist pads without substantially electroplating said material onto said horizontally oriented top surface of said photoresist pads.

20. The method for forming an electroplated structure in a flat panel display device as recited in claim 16 further comprising the step of:

d) removing said photoresist pads such that a cavity partially encapsulated by electroplated walls remains, said electroplated walls adapted to focus said electrons emitted by said electron emitting portions of said flat panel display device.

21. The method for forming an electroplated structure in a flat panel display device as recited in claim 16 wherein said electroplating seed layer is comprised of Nickel.

22. The method for forming an electroplated structure in a flat panel display device as recited in claim 16 wherein said electroplating material is comprised of Nickel.

* * * * *